US012748167B2

United States Patent

(12) United States Patent
Zhao et al.

(10) Patent No.: US 12,748,167 B2

(45) Date of Patent: Sep. 29, 2026

(54) MAGNETIC FIELD ENHANCEMENT ASSEMBLY AND MAGNETIC FIELD ENHANCEMENT DEVICE

(71) Applicants: TSINGHUA UNIVERSITY, Beijing (CN); BEIJING TSINGHUA CHANGGUNG HOSPITAL, Beijing (CN)

(72) Inventors: Qian Zhao, Beijing (CN); Zhong-Hai Chi, Beijing (CN); Yong-Gang Meng, Beijing (CN); Zhuo-Zhao Zheng, Beijing (CN); Yi Yi, Beijing (CN); Ya-Kui Wang, Beijing (CN)

(73) Assignees: TSINGHUA UNIVERSITY, Beijing (CN); BEIJING TSINGHUA CHANGGUNG HOSPITAL, Beijing (CN)

( * ) Notice: Subject to any disclaimer, the term of this patent is extended or adjusted under 35 U.S.C. 154(b) by 588 days.

(21) Appl. No.: 18/276,654

(22) PCT Filed: Aug. 9, 2021

(86) PCT No.: PCT/CN2021/111527

§ 371 (c)(1),
(2) Date: Mar. 9, 2024

(87) PCT Pub. No.: WO2022/170745

PCT Pub. Date: Aug. 18, 2022

(65) Prior Publication Data

US 2024/0329171 A1 Oct. 3, 2024

(30) Foreign Application Priority Data

Feb. 10, 2021 (CN) ......................... 202110183919.9
Feb. 10, 2021 (CN) ......................... 202110183927.3

(51) Int. Cl.

*G01R 33/36* (2006.01)
*G01R 33/28* (2006.01)
*G01R 33/565* (2006.01)

(52) U.S. Cl.

CPC ....... *G01R 33/3664* (2013.01); *G01R 33/288* (2013.01); *G01R 33/3628* (2013.01); *G01R 33/5659* (2013.01)

(58) Field of Classification Search

CPC .............. G01R 33/3664; G01R 33/288; G01R 33/3628; G01R 33/5659; G01R 33/3642
See application file for complete search history.

(56) References Cited

U.S. PATENT DOCUMENTS 5,998,999 A 12/1999 Richard et al.
6,850,067 B1 2/2005 Burl et al.
(Continued)

FOREIGN PATENT DOCUMENTS

CN 101292175 A 10/2008
CN 201662614 U 12/2010
(Continued)

OTHER PUBLICATIONS

Stoja et al., "Numerical Investigation of a self-detuning Signal Enhancement Metasurface for 3T MRI," 2020 XXXIIIrd General Assembly and Scientific Symposium of the International Union of Radio Science, Rome, Italy, 2020, pp. 1-4 (Year: 2020).*
(Continued)

*Primary Examiner* — Daniel R Miller

(57) ABSTRACT

A magnetic field enhancing component, including: a first dielectric layer comprising a first surface and a second surface opposite to each other; a first electrode layer arranged on the first surface; a second electrode layer and a fourth electrode layer, which are arranged on the second surface at an interval, where orthographic projections of the
(Continued)

first electrode layer and the second electrode layer, which are projected onto the first dielectric layer, overlap each other, and orthographic projections of the first electrode layer and the fourth electrode layer, which are projected onto the first dielectric layer, overlap each other; and a first external capacitor, a second external capacitor, and a first switching control circuit. One terminal of the second external capacitor is connected to the second electrode layer, and another terminal of the second external capacitor is connected to one terminal of the first external capacitor and one terminal of the first switching control circuit, respectively. Another terminal of the first external capacitor and another terminal of the first switching control circuit each are connected to the first electrode layer. The first switching control circuit is configured to be turned on in an RF transmitting period and to be turned off in an RF receiving period.

13 Claims, 7 Drawing Sheets

(56) References Cited

U.S. PATENT DOCUMENTS

| | | | | |
|---|---|---|---|---|
| 2007/0106148 | A1* | 5/2007 | Dumoulin | G01R 33/285 600/410 |
| 2014/0002085 | A1 | 1/2014 | Biber et al. | |
| 2014/0171784 | A1* | 6/2014 | Ooi | G01R 33/56509 600/414 |
| 2016/0310229 | A1* | 10/2016 | Bammer | A61B 90/39 |
| 2018/0356483 | A1* | 12/2018 | Zhang | A61B 5/055 |
| 2020/0408861 | A1 | 12/2020 | Park et al. | |

FOREIGN PATENT DOCUMENTS

| | | | | |
|---|---|---|---|---|
| CN | 104698411 | A | 6/2015 | |
| CN | 104734511 | A | 6/2015 | |
| CN | 108648981 | A | 10/2018 | |
| CN | 110638453 | A * | 1/2020 | G01R 33/0052 |
| CN | 110678769 | A | 1/2020 | |
| DE | 4422069 | C1 | 9/1995 | |
| JP | 1990203839 | A | 8/1990 | |
| JP | 2003204949 | A | 7/2003 | |
| KR | 1020190121226 | A | 10/2019 | |

OTHER PUBLICATIONS

Saha, S., Pricci, R., Koutsoupidou, M. et al. A smart switching system to enable automatic tuning and detuning of metamaterial resonators in MRI scans. Sci Rep 10, 10042 (2020) (Year: 2020).*

International Search Report of PCT/CN2021/111527.

Zhao, Qian et al., “Isotropic negative permeability composite material based on Mie resonance in BST MgO medium”, Science in China Press, vol. 53, No. 17, 2016 ~ 2020, 5 pages, Sep. 8, 2008(English Abstract provided).

Notification to Grant Patent Right for Invention (CN Application No. 202110183927.3) , dated Mar. 20, 2024, 4 pages.

Notification to Grant Patent Right for Invention (CN Application No. 202110183919.9) , dated Mar. 20, 2024, 4 pages.

European First Office Action (EP Application No. 21925398.6) , dated Jul. 16, 2024, 12 pages.

* cited by examiner

MAGNETIC FIELD ENHANCEMENT ASSEMBLY AND MAGNETIC FIELD ENHANCEMENT DEVICE

CROSS-REFERENCE TO RELATED APPLICATION

The present application is a U.S. National Stage of International Application No. PCT/CN2021/111527, filed on Aug. 9, 2021, which claims priority to Chinese patent application No. 202110183927.3, filed on Feb. 10, 2021, and entitled "Magnetic Field Enhancing Component and Magnetic Field Enhancing Device" and Chinese patent application No. 202110183919.9, filed on Feb. 10, 2021, and entitled "Magnetic Field Enhancing Component and Magnetic Field Enhancing Device", which are hereby incorporated by reference in their entirety.

TECHNICAL FIELD

The present application relates to magnetic resonance imaging technology, in particular to a magnetic field enhancing component and a magnetic field enhancing device.

BACKGROUND

Magnetic Resonance Imaging (MRI) technology is a non-invasive detection manner, and is important and basic diagnostic technology in the fields of medicine, biology and neuroscience. Strength of a signal transmitted by a traditional MRI equipment mainly depends on the intensity of the static magnetic field B0. By using a high magnetic field intensity or even ultra-high magnetic field intensity system, a signal-to-noise ratio and a resolution of an image may be improved, and a scan time thereof may be shortened. However, the increase of the static magnetic field intensity will cause following three problems: (1) The non-uniformity of the radio frequency (RF) field increases, and the difficulty of tuning increases. (2) The heat production of human tissues increases, which brings safety hazards, and a patient is easy to have adverse reactions, such as dizziness and vomiting. (3) The purchase cost will increase significantly, which is a burden for most small-scale hospitals. Therefore, how to obtain high imaging quality while using the static magnetic field intensity as low as possible has become a crucial issue in the MRI technology.

In order to solve the above problems, a metasurface device is provided in the prior art. The metasurface device includes a supporting structure, and a plurality of magnetic field enhancing components arranged at intervals on the side wall of the arc-shaped supporting structure. The magnetic field enhancing component may be used to increase the RF magnetic field intensity and reduce the specific absorption rate, thereby achieving the effects of improving the imaging resolution and reducing the signal-to-noise ratio.

However, current metasurface devices provided all have linearly resonant property, and are capable of enhancing all resonant frequencies thereof and the RF magnetic fields nearby. There are two RF periods in the MRI system: an RF transmitting period and an RF receiving period, and the RF fields in these two periods have the same resonant frequency. Therefore, the metasurface devices will greatly increase the RF transmitting field while enhancing the RF receiving field. After the RF transmitting field is enhanced, a specific absorption rate (SAR) of the human body will increase significantly. Therefore, the introduction of metasurfaces will cause a substantial increase in the heat production of human body and bring safety hazards.

SUMMARY

In order to solve the problem in the prior art that the introduction of metasurfaces will cause a substantial increase in the heat production of human body and bring safety hazards, a magnetic field enhancing component and a magnetic field enhancing device are provided.

A magnetic field enhancing component includes: a first dielectric layer including a first surface and a second surface opposite to each other: a first electrode layer arranged on the first surface: a second electrode layer and a fourth electrode layer, which are arranged on the second surface at an interval, wherein orthographic projections of the first electrode layer and the second electrode layer, which are projected onto the first dielectric layer, overlap each other, and orthographic projections of the first electrode layer and the fourth electrode layer, which are projected onto the first dielectric layer, overlap each other; and a first external capacitor, a second external capacitor, and a first switching control circuit.

One terminal of the second external capacitor is connected to the second electrode layer, and another terminal of the second external capacitor is connected to one terminal of the first external capacitor and one terminal of the first switching control circuit, respectively.

Another terminal of the first external capacitor and another terminal of the first switching control circuit each are connected to the first electrode layer.

The first switching control circuit is configured to be turned on in an RF transmitting period and to be turned off in an RF receiving period.

A magnetic field enhancing component includes: a first dielectric layer including a first surface and a second surface arranged opposite to each other: a first electrode layer arranged on the first surface and covering part of the first surface: a second electrode layer arranged on the second surface and covering part of the second surface, where an orthographic projection of the first electrode layer projected onto the first dielectric layer overlaps an orthographic projection of the second electrode layer projected onto the first dielectric layer to form a first structural capacitor; and a first external capacitor, a second external capacitor and a first switching control circuit.

One terminal of the second external capacitor is connected to the second electrode layer, and another terminal of the second external capacitor is connected to one terminal of the first external capacitor and one terminal of the first switching control circuit, respectively.

Another terminal of the first external capacitor and another terminal of the first switching control circuit each are connected to the first electrode layer.

The first switching control circuit is configured to be turned on in an RF transmitting period and to be turned off in an RF receiving period.

A magnetic field enhancing device includes: a cylindrical supporting structure having a third end and a fourth end which spaced and opposite to each other: a plurality of magnetic field enhancing components, which are arranged on the cylindrical supporting structure at intervals and extend from the third end towards the fourth end: a first annular conductive sheet arranged on the cylindrical supporting structure and proximate to the third terminal, and electrically connected to portions, located at the third end, of the plurality of magnetic field enhancing components; and a second annular conductive sheet arranged on the cylindrical supporting structure and proximate to the fourth end, and electrically connected to portions, located at the fourth end, of the plurality of magnetic field enhancing components.

A magnetic field enhancing component includes: a first dielectric layer including a first surface and a second surface opposite to each other: a first electrode layer arranged on the first surface: a second electrode layer and a fourth electrode layer, which are arranged on the second surface at an interval, where orthographic projections of the first electrode layer and the second electrode layer, which are projected onto the first dielectric layer, overlap each other, and orthographic projections of the first electrode layer and the fourth electrode layer, which are projected onto the first dielectric layer, overlap each other; and a third external capacitor, two terminals of the third external capacitor being connected to the first electrode layer and the second electrode layer, respectively; and a fourth external capacitor and a second switching control circuit. One terminal of the fourth external capacitor is connected to the second electrode layer. Another terminal of the fourth external capacitor is connected to one terminal of the second switching control circuit. Another terminal of the second switching control circuit is connected to the first electrode layer. The second switching control circuit is configured to be turned on in an RF transmitting period and to be turned off in an RF receiving period.

A magnetic field enhancing component includes: a first dielectric layer including a first surface and a second surface opposite to each other: a first electrode layer arranged on the first surface and covering part of the first surface: a second electrode layer arranged on the second surface and covering part of the second surface, where an orthographic projection of the first electrode layer projected onto the first dielectric layer overlaps an orthographic projection of the second electrode layer projected onto the first dielectric layer to form a first structural capacitor: a third external capacitor, two terminals of the third external capacitor being connected to the first electrode layer and the second electrode layer, respectively; and a fourth external capacitor and a second switching control circuit, which are connected in series between the first electrode layer and the second electrode layer. The second switching control circuit is configured to be turned on in an RF transmitting period and to be turned off in an RF receiving period.

In an embodiment, the first dielectric layer includes a first end and a second end opposite to each other.

The first electrode layer and the second electrode layer are strip-shaped and have the same width. The first electrode layer is configured to extend from the second end towards the first end. The second electrode layer is configured to extend from the first end towards the second end.

The orthographic projection of the first electrode layer projected onto the first dielectric layer overlaps the orthographic projection of the second electrode layer projected onto the first dielectric layer to form the first structural capacitor.

A magnetic field enhancing device includes: a cylindrical supporting structure having a third end and a fourth end which spaced and opposite to each other: a plurality of magnetic field enhancing components, which are arranged on the cylindrical supporting structure at intervals and extend from the third end towards the fourth end: a first annular conductive sheet arranged on the cylindrical supporting structure and proximate to the third terminal, and electrically connected to portions, located at the third end, of the plurality of magnetic field enhancing components; and a second annular conductive sheet, arranged on the cylindrical supporting structure and proximate to the fourth end, and electrically connected to portions, located at the fourth end, of the plurality of magnetic field enhancing components.

In the magnetic field enhancing components and the magnetic field enhancing device provided in the embodiments of the present application, in the RF transmitting period, the voltage difference across the second structural capacitor is comparatively large, thus making the first switching control circuit to be turned on, so that the first external capacitor is short-circuited, and only the second external capacitor is connected between the first electrode layer and the second electrode layer. The arrangement of the second external capacitor may reduce a degree of detuning or avoid detuning in the RF transmitting period of the loop where the magnetic field enhancing components are located. The arrangement of the second external capacitor may make the magnetic field intensity in the detected region in the MRI system identical when the magnetic field enhancing component is being used and before the magnetic field enhancing component is used. Therefore, in the RF transmitting period, the magnetic field intensity in the detected region in the MRI system remains consistent all the time, thereby effectively reducing the adverse effects of magnetic field enhancement on the human body. The magnetic field intensity in the detected region remaining the original magnetic field intensity may eliminate the interference of the magnetic field enhancing component in the RF transmitting period, thereby significantly improving the clinical practicability of the magnetic field enhancing device composed of the plurality of the magnetic field enhancing components. The magnetic field enhancing device may be applied to all sequences of the MRI system.

BRIEF DESCRIPTION OF THE DRAWINGS

In order to illustrate the embodiments of the present application or the technical solutions in the prior art more clearly, the accompanying drawings needed for describing the embodiments or the prior art will be described briefly in the following description. Obviously, the drawings described herein are merely some examples of the present application. For those of ordinary skill in the art, other drawings may be obtained according to these drawings without creative efforts.

Figure 1:
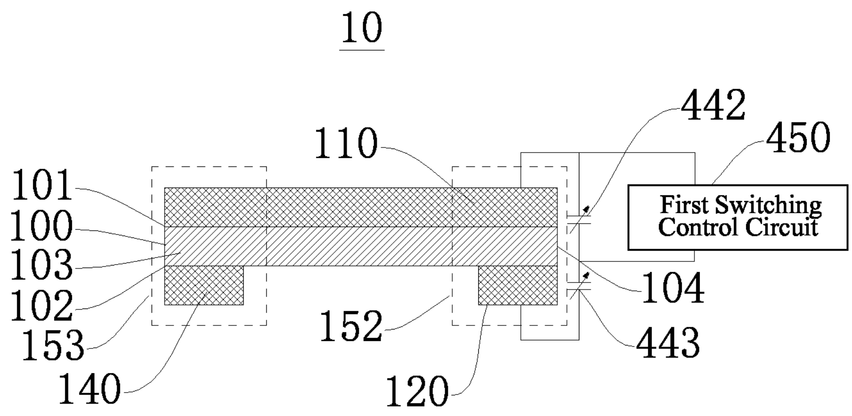
FIG. 1 is a view showing a structure of a first magnetic field assembly provided by the present application.

IN THE DRAWINGS first magnetic field enhancing component 10, second magnetic field enhancing component 20, third magnetic field enhancing component 30, fourth magnetic field enhancing component 40, first dielectric layer 100, first electrode layer 110, second electrode layer 120, third electrode layer 130, fourth electrode layer 140, first surface 101, second surface 102, first opening 411, second opening 412, third opening 413, fourth opening 414, first switching control circuit 450, second switching control circuit 460, first diode 451, second diode 452, third diode 461, fourth diode 462, first enhancement-mode MOSFET 453, second enhancement-mode MOSFET 454, third enhancement-mode MOSFET 463, fourth enhancement-mode MOSFET 464, first external capacitor 442, second external capacitor 443, third external capacitor 444, fourth external capacitor 445, first end 103, second end 104, magnetic field enhancing device 80, cylindrical supporting structure 50, third end 51, fourth end 53, first annular conductive sheet 510, second annular conductive sheet 520, limiting structure 530, axis 504, detecting space 509, first structural capacitor 150, second structural capacitor 152, third structural capacitor 153, through hole 160.

DETAILED DESCRIPTION OF THE EMBODIMENTS

In order to facilitate the understanding of the present application, the present application will be described more fully herein with reference to the relevant drawings. Preferred embodiments of the application are shown in the accompanying drawings. However, the present application may be implemented in many different forms and is not limited to the embodiments described herein. On the contrary, the purpose of providing these embodiments is to make the disclosure of the present application to be understood more thoroughly and comprehensively.

It should be noted that when an element is referred to as being "fixed" to another element, it may be fixed directly on the other element or there may also be an intermediate element. When an element is referred to as being "connected to" another element, the element may be directly connected to the other element or there may be an intermediate element. The terms "vertical", "horizontal", "left", "right", and similar expressions are used herein for purposes of illustration only, but are not intended to represent the only embodiment.

Unless otherwise defined, all technical and scientific terms used herein have the same meanings as commonly understood by the ordinary skill in the art of the present application. The terminology used in the specification of the present application is only used for the purpose of describing specific embodiments, but not intended to limit the present application. As used herein, the term "and/or" in the disclosure includes any and all combinations of one or more of associated listed items.

The terms "first" and "second" mentioned in the present application do not represent specific numbers and a specific order, but are only used to distinguish names.

An embodiment of the present application provides a magnetic field enhancing component. Referring to FIG. 1, the magnetic field enhancing component may be a first magnetic field enhancing component 10. The first magnetic field enhancing component 10 includes a first dielectric layer 100, a first electrode layer 110, a second electrode layer 120, a fourth electrode layer 140, a first external capacitor 442, a second external capacitor 443, and the first switching control circuit 450.

The first dielectric layer 100 includes a first surface 101 and a second surface 102 opposite to each other. The first electrode layer 110 is arranged on the first surface 101. The second electrode layer 120 and the fourth electrode layer 140 are arranged on the second surface 102 at an interval. Orthographic projections of the first electrode layer 110 and the second electrode layer 120, which are projected onto the first dielectric layer 100, have an overlapped portion; and the orthographic projections of the first electrode layer 110 and the fourth electrode layer 140, which are projected onto the first dielectric layer 100, have an overlapped portion. One terminal of the second external capacitor 443 is connected to the second electrode layer 120. Another terminal of the second external capacitor 443 is connected to one terminal of the first external capacitor 442 and one terminal of the first switching control circuit 450 respectively. Another terminal of the first external capacitor 442 and another terminal of the first switching control circuit 450 each are connected to the first electrode layer 110. The first switching control circuit 450 is configured to be turned on in the RF transmitting period and be turned off in the RF receiving period.

The first dielectric layer 100 may be made of insulating material. The first dielectric layer 100 may perform a function of supporting the first electrode layer 110, the second electrode layer 120 and the fourth electrode layer 140. The first dielectric layer 100 may have a rectangular plate structure. In an embodiment, the first dielectric layer

100 may be made of epoxy glass fiber. The first electrode layer 110 and the second electrode layer 120 may also have rectangular plate structures. The first electrode layer 110 and the second electrode layer 120 may be made of conductive and non-magnetic material. In an embodiment, the first electrode layer 110 and the second electrode layer 120 may be made of metal material such as gold, silver, copper, etc.

The first dielectric layer 100 includes a first end 103 and a second end 104 opposite to each other. The first electrode layer 110 arranged on the first surface 101 may extend from the first end 103 to the second end 104. The second electrode layer 120 and the fourth electrode layer 140 are arranged at an interval. The second electrode layer 120 is located on the second end 104 of the second surface 102. The fourth electrode layer 140 is located on the first end 103 of the second surface 102.

In an embodiment, thicknesses of the first electrode layer 110, the second electrode layer 120 and the fourth electrode layer 140 may be equal. Planes where the first electrode layer 110, the second electrode layer 120, the fourth electrode layer 140, and the first dielectric layer 100 are located respectively, may be substantially parallel to each other.

The orthographic projections of the first electrode layer 110 and the second electrode layer 120, which are projected onto the first dielectric layer 100, have an overlapped portion. The orthographic projections of the first electrode layer 110 and the fourth electrode layer 140, which are projected onto the first dielectric layer 100, have an overlapped portion. At portions of the second electrode layer 120 and the first electrode layer 110, which correspond to the overlapped portion of the orthographic projections of the first electrode layer 110 and the second electrode layer 120 projected onto the first dielectric layer 100, a second structural capacitor 152 is formed by the first electrode layer 110, the second electrode layer 120 and the first dielectric layer 100. At portions of the fourth electrode layer 140 and the first electrode layer 110, which correspond to the overlapped portion of the orthographic projections of the fourth electrode layer 140 and the first electrode layer 110 projected onto the first dielectric layer 100 respectively, a third structural capacitor 153 is formed by the first electrode layer 110, the fourth electrode layer 140 and the first dielectric layer 100.

An equivalent inductor is formed at another portion of the first electrode layer 110, which corresponds to a non-overlapped portion when the first electrode layer 110, the second electrode layer 120, and the fourth electrode layer 140 are projected on the first dielectric layer 100. The second structural capacitor 152, the third structural capacitor 153 and the equivalent inductor may form an LC oscillator circuit. The LC oscillator circuit may make a resonant frequency of a loop formed by a plurality of first magnetic field enhancing components 10 equal to a frequency of a RF coil in the MRI system. When a loop including the first magnetic field enhancing components 10 is placed in the MRI system, under the action of the excitation field, the plurality of first magnetic field enhancing components 10 cooperate with each other to enhance the magnetic field.

It may be understood that there is a time difference of tens to thousands of milliseconds between the RF transmitting period and the RF receiving period. A difference in the RF power between the RF transmitting period and the RF receiving period reaches 3 orders of magnitude. In the RF transmitting period, a voltage across the structural capacitor ranges from several volts to hundreds of volts. In the RF receiving period, a voltage across the structural capacitor is at a millivolt level.

The other terminal of the second external capacitor 443 is connected to the one terminal of the first external capacitor 442 and the one terminal of the first switching control circuit 450 respectively. The other terminal of the first switching control circuit 450 is connected to the first electrode layer 110. That is, the other terminal of the first switching control circuit 450 is connected between the first external capacitor 442 and the second external capacitor 443. When the first switching control circuit 450 is turned on, the first external capacitor 442 is short-circuited. When the first switching control circuit 450 is turned on, the second external capacitor 443 is connected between the first electrode layer 110 and the second electrode layer 120. When the first switching control circuit 450 is turned off, the first external capacitor 442 and the second external capacitor 443 are connected in series between the first electrode layer 110 and the second electrode layer 120.

A voltage-gate threshold of the first switching control circuit 450 may be greater than 1 volt. When a voltage difference between the first electrode layer 110 and the second electrode layer 120 is greater than 1 volt, the first switching control circuit 450 is turned on. When the voltage difference between the first electrode layer 110 and the second electrode layer 120 is less than 1 volt, the first switching control circuit 450 is turned off.

In the RF transmitting period, the voltage difference across the second structural capacitor 152 is comparatively large, thus making the first switching control circuit 450 to be turned on. When the first switching control circuit 450 is turned on, the first external capacitor 442 is short-circuited. When the first external capacitor 442 is short-circuited, only the second external capacitor 443 is connected between the first electrode layer 110 and the second electrode layer 120. The second external capacitor 443 may reduce a degree of detuning or avoid detuning in the RF transmitting period of the loop where the first magnetic field enhancing components 10 are located. The second external capacitor 443 may make the magnetic field intensity in the detected region in the MRI system identical when the first magnetic field enhancing component 10 is being used and before the first magnetic field enhancing component 10 is used. Therefore, in the RF transmitting period, the magnetic field intensity in the detected region in the MRI system remains consistent all the time, and the magnetic field intensity in the detected region remains the original magnetic field intensity. The magnetic field intensity in the detected region remaining the original one may eliminate the interference of the first magnetic field enhancing component 10 in the RF transmitting period, thereby significantly improving the clinical practicability of the magnetic field enhancing device 80 composed of the plurality of the first magnetic field enhancing components 10. The magnetic field enhancing device 80 may be applied to all sequences of the MRI system. The first magnetic field enhancing component 10 may effectively reduce the adverse effects of magnetic field enhancement on the human body. In the RF receiving period, the voltage across the second structural capacitor 152 is comparatively small, and the first switching control circuit 450 is turned off.

Figure 2:
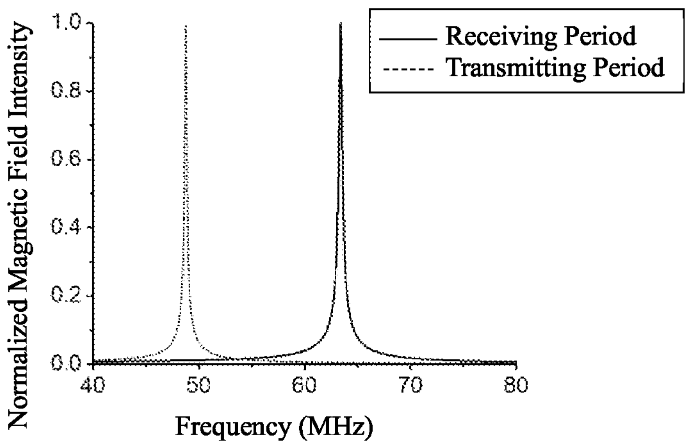
FIG. 2 is view showing a comparison between frequencies in an RF transmitting period and frequencies in an RF receiving period of the first magnetic field enhancing component provided by the present application.

In the RF receiving period, the first external capacitor 442 and the second external capacitor 443 are connected in series between the first electrode layer 110 and the second electrode layer 120. Referring to FIG. 2, the first external capacitor 442 and the second external capacitor 443 may make the loop where the first magnetic field enhancing components 10 are located have a better resonant frequency in the RF receiving period. The first external capacitor 442 and the second external capacitor 443 may make the resonant frequency of the loop where the first magnetic field enhancing components 10 are located in the receiving period reach the operating frequency of the MRI system. Therefore, the first magnetic field enhancing component 10 may realize a function of enhancing the RF transmitting field.

The first external capacitor 442 and the second external capacitor 443 may be fixed capacitors or variable capacitors. When the application environment of the first magnetic field enhancing component 10 is determined, for example, the frequency of the RF coil is determined, the first external capacitor 442 and the second external capacitor 443 may be fixed capacitors. The first external capacitor 442 and the second external capacitor 443 make the resonant frequency of the loop where the magnetic field enhancing components 10 are located equal to the frequency of the RF coil, thereby enhancing the magnetic field. When the application environment of the first magnetic field enhancing component 10 is uncertain, for example, when the frequency of the RF coil is uncertain, the first external capacitor 442 and the second external capacitor 443 may be variable capacitors. The resonant frequency of the loop where a resonance adjusting circuit 400 is located may be adjusted by adjusting the variable capacitors, thus enabling the first magnetic field enhancing component 10 to be applied in different environments.

As to the first magnetic field enhancing component 10 provided in the embodiments of the present application, in the RF transmitting period, as the voltage difference between the first electrode layer 110 and the second electrode layer 120 is comparatively large, the first switching control circuit 450 is turned on. In the RF transmitting period, only the second external capacitor 443 is connected between the first electrode layer 110 and the second electrode layer 120. The second external capacitor 443 may reduce the degree of detuning of the loop where the first magnetic field enhancing components 10 are located in the RF transmitting period. In the RF transmitting period, the second external capacitor 443 may make the magnetic field intensity in the detected region in the MRI system identical when the first magnetic field enhancing component 10 is being used and before the first magnetic field enhancing component 10 is used. Therefore, in the RF transmitting period, the magnetic field intensity in the detected region in the MRI system remains consistent all the time, that is, the magnetic field intensity in the detected region may remain the original magnetic field intensity. The second external capacitor 443 may eliminate the interference of the first magnetic field enhancing component 10 in the RF transmitting period, thereby significantly improving the clinical practicability of the magnetic field enhancing device 80 composed of the plurality of first magnetic field enhancing components 10. Therefore, the magnetic field enhancing device 80 may be applied to all sequences of the MRI system, and effectively reduce the adverse effects on the human body as well.

The first magnetic field enhancing component 10 is a partially-tuned nonlinear metasurface device for enhancement of MR imaging. The partially-tuned nonlinear metasurface device for enhancement of MR imaging. In the RF transmitting period, the first switching control circuit 450 is turned on. In the RF receiving period, the first switching control circuit 450 is turned off. In the RF transmitting period, a frequency band, which is focused by the partially-tuned nonlinear metasurface device for enhancement of MR imaging by using the nonlinear resonant property, has only part of the resonant property. In the RF transmitting period, the second external capacitor 443 may reduce the degree of detuning of the loop where the first magnetic field enhancing components 10 are located.

In the RF transmitting period, the magnetic field intensity in the detected region in the MRI system remains consistent all the time, and the magnetic field intensity of the detected region remains the original magnetic field intensity. Therefore, the second external capacitor 443 can eliminate the interference of the first magnetic field enhancing component 10 in the RF transmitting period. The first magnetic field enhancing component 10 may effectively improve the clinical practicability of the magnetic field enhancing device 80 composed of the plurality of the first magnetic field enhancing components 10. The magnetic field enhancing device 80 can be applied to all sequences of the MRI system, and can effectively reduce the adverse effects on the human body as well.

Figure 3:
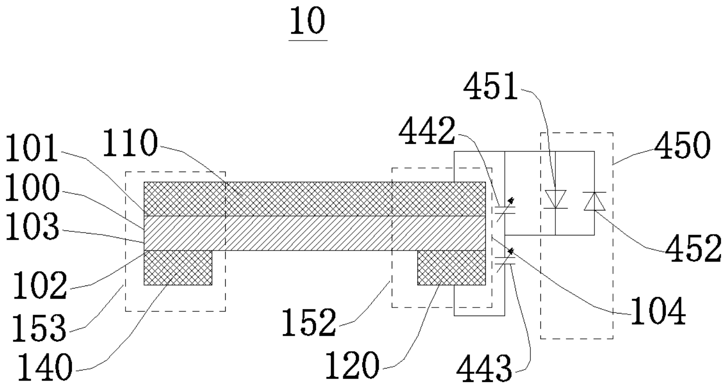
FIG. 3 is a view showing a structure of the first magnetic field enhancing component provided by the present application.

Referring to FIG. 3, in an embodiment, the first switching control circuit 450 includes a first diode 451 and a second diode 452. An anode of the first diode 451 is connected to the first electrode layer 110. A cathode of the second diode 452 is connected to the first electrode layer 110. The one terminal of the second external capacitor 443 is connected to the second electrode layer 120. The other terminal of the second external capacitor 443 is connected to a cathode of the first diode 451, an anode of the second diode 452, and the one terminal of the first external capacitor 442 respectively. The other terminal of the first external capacitor 442 is connected to the first electrode layer 110.

It may be understood that a forward voltage of the first diode 451 and a forward voltage of the second diode 452 may be between 0 volt and 1 volt. In an embodiment, the forward voltages of the first diode 451 and the second diode 452 may be 0.8V. The first diode 451 and the second diode 452 each are connected in series between the first electrode layer 110 and the second electrode layer 120, that is to say, the first diode 451 and the second diode 452 are reversely connected.

Due to alternating current (AC) characteristics of the RF, induced voltages generated by the first electrode layer 110 and the second electrode layer 120 are also AC voltages. In the RF transmitting period, the voltage difference between the first electrode layer 110 and the second electrode layer 120 exceeds the forward voltages of the first diode 451 and the second diode 452. Therefore, no matter which of the first electrode layer 110 and the second electrode layer 120 has a higher voltage, one of the first diode 451 and the second diode 452 is always in a conducting state. In the RF transmitting period, the first external capacitor 442 is short-circuited.

However, in the RF receiving period, since the voltage difference between the first electrode layer 110 and the second electrode layer is less than the forward voltages of the first diode 451 and the second diode 452, no matter which of the first electrode layer 110 and the second electrode layer 120 has a higher voltage, the first diode 451 and the second diode 452 are in a non-conducting state. In the RF receiving period, the first external capacitor 442 and the second external capacitor 443 are connected in series between the first electrode layer 110 and the second electrode layer 120.

Figure 4:
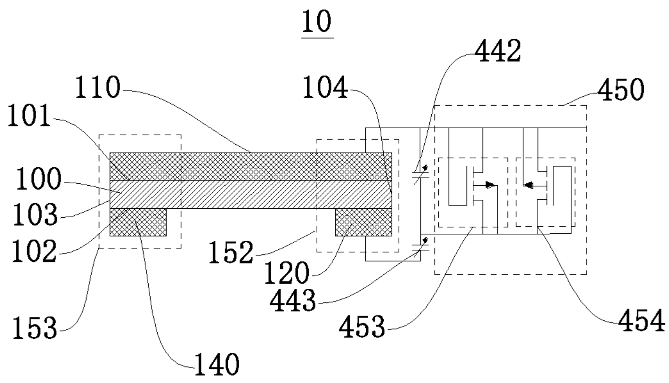
FIG. 4 is a view showing a structure of the first magnetic field enhancing component provided by the present application.

Referring to FIG. 4, in an embodiment, the first switching control circuit 450 may include a first enhancement-mode MOSFET 453 and a second enhancement-mode MOSFET 454. The drain of the first enhancement-mode MOSFET 453 is connected to the first electrode layer 110. The grid of the first enhancement-mode MOSFET 453 is connected to the first electrode layer 110. The source of the second enhancement-mode MOSFET 454 is connected to the first electrode layer 110. The one terminal of the second external capacitor 443 is connected to the second electrode layer 120. The other terminal of the second external capacitor 443 is connected to the source of the first enhancement-mode MOSFET 453, the drain of the second enhancement-mode MOSFET 454, the grid of the second enhancement-mode MOSFET 454, and the one terminal of the first external capacitor 442, respectively. The other terminal of the first external capacitor 442 is connected to the first electrode layer 110. The first enhancement-mode MOSFET 453 and the second enhancement-mode MOSFET 454 are reversely connected.

The first enhancement-mode MOSFET 453 and the second enhancement-mode MOSFET 454 are turned off when grid voltages thereof are less than a threshold voltage, that is, only when the grid voltage is greater than a threshold voltage can a conductive channel appear.

It may be understood that, in the RF transmitting period, the voltage difference between the first electrode layer 110 and the second electrode layer 120 exceed the threshold voltage which allows the first enhancement-mode MOSFET 453 and the second enhancement-mode MOSFET 454 to be turned on, therefore no matter which of the first electrode layer 110 and the second electrode layer has a higher voltage, one of the first enhancement-mode MOSFET 453 and the second enhancement-mode MOSFET 454 is always in a conducting state. In the RF transmitting period, the first external capacitor 442 is short-circuited.

In the RF receiving period, the voltage difference between the first electrode layer 110 and the second electrode layer is less than the threshold voltage which allows the first enhancement-mode MOSFET 453 and the second enhancement-mode MOSFET 454 to be turned on, therefore, no matter which of the first electrode layer 110 and the second electrode layer 120 has a higher voltage, the first enhancement-mode MOSFET 453 and the second enhancement-mode MOSFET 454 are in a non-conducting state. In the RF receiving period, the first external capacitor 442 and the second external capacitor 443 are connected in series between the first electrode layer 110 and the second electrode layer 120.

The first switching control circuit 450 is turned off in the RF receiving period, and at this time, the first electrode layer 110 and the fourth electrode layer 140 may form the third structural capacitor 153. The third structural capacitor 153 and the second structural capacitor 152 cooperate with each other to further improve the effect of magnetic field enhancement.

In an embodiment, the one terminal of the first switching control circuit 450 is connected to the portion of the second electrode layer 120, which corresponds to the overlapped portion of the orthographic projections of the first electrode layer 110 and the second electrode layer 120 projected onto the first dielectric layer 100. The other terminal of the first switching control circuit 450 is connected to the portion of the first electrode layer 110, which corresponds to the overlapped portion of the orthographic projections of the first electrode layer 110 and the second electrode layer 120 projected onto the first dielectric layer 100. That is, the portion of the first electrode layer 110, to which the first switching control circuit 450 is connected, is the portion of the first electrode layer 110 forming the second structural capacitor 152. Therefore, the first switching control circuit 450 can be prevented from being connected to the other portion of the first electrode layer 110, which is not used to form the second structural capacitor 152 and the third structural capacitor 153. The other portion of the first electrode layer 110, which is not used to form the second structural capacitor 152 and the third structural capacitor 153, functions as the equivalent inductor. Therefore, when the other terminal of the first switching control circuit 450 is connected to the portion of the first electrode layer 110, which corresponds to the overlapped portion of the orthographic projections of the first electrode layer 110 and the second electrode layer 120 projected onto the first dielectric layer 100, the other portion of the first electrode layer 110, which forms the equivalent inductor, will not be affected.

Figure 5:
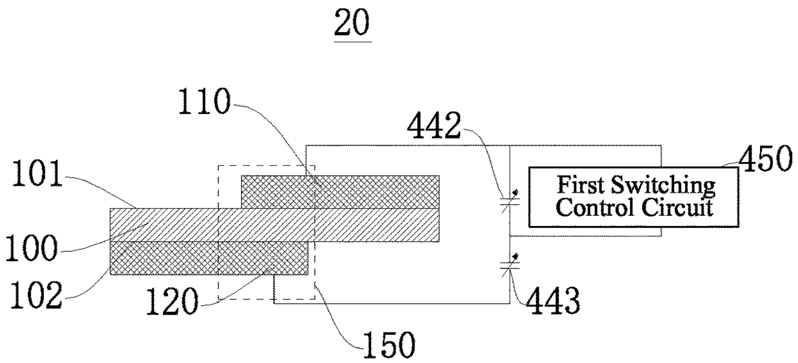
FIG. 5 is a view showing a structure of a second magnetic field enhancing component provided by the present application.

An embodiment of the present application further provides a magnetic field enhancing component. Referring to FIG. 5, the magnetic field enhancing component is a second magnetic field enhancing component 20. The second magnetic field enhancing component 20 includes the first electrode layer 110, the second electrode layer 120, the first dielectric layer 100, the first external capacitor 442, the second external capacitor 443 and the first switching control circuit 450. The first dielectric layer 100 includes the first surface 101 and the second surface 102 arranged opposite to each other. The first electrode layer 110 is arranged on the first surface 101, and the first electrode layer 110 covers part of the first surface 101. The second electrode layer 120 is arranged on the second surface 102, and the second electrode layer 120 covers part of the second surface 102. The orthographic projection of the first electrode layer 110 projected onto the first dielectric layer 100 overlaps the orthographic projection of the second electrode layer 120 projected onto the first dielectric layer 100 to form the first structural capacitor 150. The one terminal of the second external capacitor 443 is connected to the second electrode layer 120. The other terminal of the second external capacitor 443 is connected to the one terminal of the first external capacitor 442 and the one terminal of the first switching control circuit 450, respectively. The other terminal of the first external capacitor 442 and the other terminal of the first switching control circuit 450 each are connected to the first electrode layer 110. The first switching control circuit 450 is configured to be turned on in the RF transmitting period, and to be turned off in the RF receiving period.

The first electrode layer 110 covering part of the first surface 101 means that other part of the first surface 101 is not covered by the first electrode layer 110. The second electrode layer 120 covering part of the second surface 102 means that the other part of the second surface 102 is not covered by the second electrode layer 120. The orthographic projections of the first electrode layer 110 and the second electrode layer 120, which are projected onto the first dielectric layer 100, overlap each other. A portion of the first electrode layer 110 and a portion of the second electrode layer 120, which are arranged opposite to each other, form the first structural capacitor 150. Portions of the first electrode layer 110 and the second electrode layer 120, which correspond to non-overlapped portions of the orthographic projections of the first electrode layer 110 and the second electrode layer 120 projected onto the first dielectric layer 100, respectively, may be used as transmission wires and function as equivalent inductors. The first structural capacitor 150 and the equivalent inductor may form the LC oscillator circuit. When the second magnetic field enhancing component 20 is used in a situation where the resonant frequency is comparatively low, the first structural capacitor 150, without needing a large capacitance, can reduce the resonant frequency of the loop where the second magnetic field enhancing component 20 is located to the operating frequency of the MRI system, thereby effectively improving the magnetic field intensity.

The magnetic field generated by the portion of the second magnetic field enhancing component 20, which forms the first structural capacitor 150, is parallel to the plane where the first dielectric layer 100 is located. However, the magnetic field parallel to the first dielectric layer 100 basically cannot play a function of detecting, and belongs to an ineffective magnetic field. The magnetic field generated by the portion of the second magnetic field enhancing component 20, which forms the equivalent inductor, is perpendicular to the first dielectric layer 100 and can generate an effective magnetic field that takes effects on the detecting region.

In an embodiment, an area of the overlapped portion of the orthographic projection of the first electrode layer 110 projected onto the first dielectric layer 100 and the orthographic projection of the second electrode layer 120 projected onto the first dielectric layer 100 is less than half of an area of the first surface 101 or half of an area of the second surface 102. Therefore, an area of the portion of the first dielectric layer 100 which forms the first structural capacitor 150 is less than half of the area of the first dielectric layer 100. By reducing the area of the first structural capacitor 150, the power consumption of the first structural capacitor 150 may be reduced. The area of the portion of the first dielectric layer 100 which forms the first structural capacitor 150 being less than half of the area of the first dielectric layer 100 may also reduce a degree of coupling between the second magnetic field enhancing component 20 and other cascaded metasurfaces, thereby significantly improving the performance of the second magnetic field enhancing component 20.

In an embodiment, the thickness of the first electrode layer 110 and the thickness of the second electrode layer 120 may be equal. The first electrode layer 110, the second electrode layer 120 and the first dielectric layer 100 are stacked. The planes where the first electrode layer 110, the second electrode layer 120 and the first dielectric layer 100 are located may be approximately parallel to each other.

It may be understood that the embodiment of the first switching control circuit 450 may be the same as or similar to that of the first switching control circuit 450 shown in FIG. 1, FIG. 3 and FIG. 4, which will not be repeated hereinafter.

Figure 6:
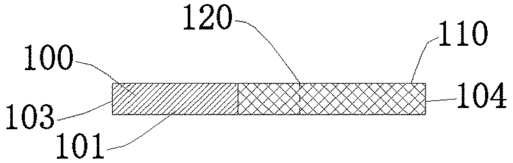
FIG. 6 is a perspective view of a second magnetic field enhancing device provided by the present application.
Figure 7:
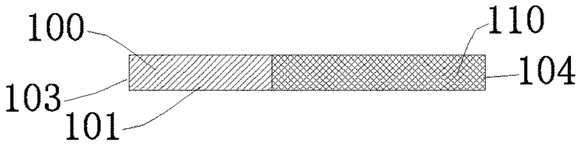
FIG. 7 is a top view of the second magnetic field enhancing device provided by the present application.
Figure 8:
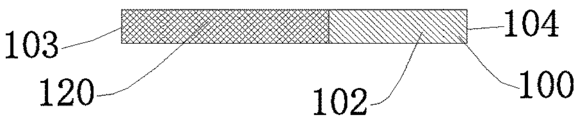
FIG. 8 is a bottom view of the second magnetic field enhancing device provided by the present application.

Referring to FIG. 6, FIG. 7 and FIG. 8, in an embodiment, the first dielectric layer 100 includes the first end 103 and the second end 104 opposite to each other. The first electrode layer 110 extends from the second end 104 towards the first end 103. The second electrode layer 120 extends from the first end 103 towards the second end 104. The orthographic projection of the first electrode layer 110 projected onto the first dielectric layer 100 overlaps the orthographic projection of the second electrode layer 120 projected onto the first dielectric layer 100 to form the first structural capacitor 150. That is, the first electrode layer 110 and the second electrode layer 120 respectively extend from the opposite ends of the first dielectric layer 100 toward middle of the first dielectric layer 100. The orthographic projections of the first electrode layer 110 and the second electrode layer 120 projected onto the first dielectric layer 100 have an overlapped portion. The overlapped portion is away from two ends of the first dielectric layer 100.

In an embodiment, a length of the first electrode layer 110 and a length of the second electrode layer 120 each are less than three quarters of a length of the first dielectric layer 100 and greater than one quarter of the length of the first dielectric layer 100. Within such a range, the first structural capacitor 150 has a comparatively small capacitance, making the power consumption thereof to be reduced. The length of the effective inductor is comparatively long, thereby effectively enhancing the magnetic field and enhancing the effect of improving the signal-to-noise ratio of an image by the second magnetic field enhancing component 20.

The overlapped portion of the orthographic projections of the first electrode layer 110 and the second electrode layer 120 is located in the middle of the first dielectric layer 100. At the overlapped portion, the first electrode layer 110, the first dielectric layer 100, and the second electrode layer 120 form the first structural capacitor 150. The portions of the first electrode layer 110 and the second electrode layer 120, which correspond to the non-overlapped portions when the first electrode layer 110 and the second electrode layer 120 are projected onto the first dielectric layer 100 may form transmission wires and function as inductors. The portions of the first electrode layer 110 and the second electrode layer 120, which correspond to the non-overlapped portions when the first electrode layer 110 and the second electrode layer 120 are projected onto the first dielectric layer 100, may also function as equivalent inductors. The equivalent inductors and the first structural capacitor 150 form an LC oscillator circuit.

The first electrode layer 110 and the second electrode layer 120 each are strip-shaped and have the same width and the same extension direction. The extension direction of the first electrode layer 110 and the extension direction of the second electrode layer 120 are located on a straight line, thus reducing the width of the second magnetic field enhancing component 20 and the volume of the second magnetic field enhancing component 20.

In an embodiment, the overlapped portion of the orthographic projections of the first electrode layer 110 and the second electrode layer 120 respectively projected onto the first dielectric layer 100 is located in the middle of the first dielectric layer 100. The first structural capacitor 150 is located in the middle of the first dielectric layer 100.

The middle of the first dielectric layer 100 may be a portion of the first dielectric layer 100 away from the edges of the first dielectric layer 100. The middle of the first dielectric layer 100 may be located at the center of the first dielectric layer 100, or may be located at a position to the left or right of the center of the first dielectric layer 100. The first structural capacitor 150 being located at the middle of the first dielectric layer 100 can effectively improve the symmetry of the structure of the second magnetic field enhancing component 20, thus improving the uniformity of the magnetic field.

In an embodiment, a target frequency range of the second magnetic field enhancing component 20 may be from 60 MHz to 150 MHz. In an embodiment, the target frequency of the second magnetic field enhancing component 20 may be 63.8 MHZ (corresponding to a main magnetic field B0 of the MRI system of 1.5T) or 128 MHZ (corresponding to a main magnetic field B0 of the MRI system of 3T). The first dielectric layer 100 may be rectangular. The length of the first dielectric layer 100 may be 250 mm. The length of the overlapped portion of the orthographic projections of the first electrode layer 110 and the second electrode layer 120 projected onto the first dielectric layer 100 may be 20 mm. That is, a length of the portion of the second magnetic field enhancing component 20, which is capable of generating an effective magnetic field, is 230 mm. The area of the portion of the second magnetic field enhancing component 20, which is capable of generating an effective magnetic field, is significantly increased.

Figure 9:
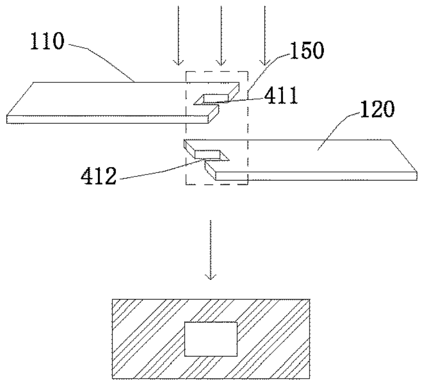
FIG. 9 shows schematic views illustrating orthographic projections of a first electrode layer and a second electrode layer projected onto a first dielectric layer provided by the present application.

Referring to FIG. 9, in an embodiment, an end of the first electrode layer 110 proximate to the second electrode layer 120 has a first opening 411. An end of the second electrode layer 120 proximate to the first electrode layer 110 has a second opening 412. Orthographic projections of the first opening 411 and the second opening 412 respectively projected onto the first dielectric layer 100 coincide. The first opening 411 and the second opening 412 may be of the same size. The first opening 411 and the second opening 412.

After the second magnetic field enhancing component 20 is placed in the excitation field of the MRI system, the portions of the second electrode layer 120 and the first electrode layer 110, which correspond to the overlapped portion of the orthographic projections of the first electrode layer 110 and the second electrode layer 120 projected onto the first dielectric layer 100, may form the first structural capacitor 150. The first opening 411 and the second opening 412 may optimize the distribution of the local magnetic field, thereby improving the detection effect of a specific position of a body part to be detected.

It may be understood that, after the first electrode layer 110 and the second electrode layer 120 in FIG. 9 rotate 180 degrees in horizontal directions relative to the first dielectric layer 100 from left to right, the positional relationship of the first electrode layer 110 and the second electrode layer 120 is the same as that of the first electrode layer 110 and the second electrode layer 120 relative to the first dielectric layer 100 shown in FIG. 5.

Figure 10:
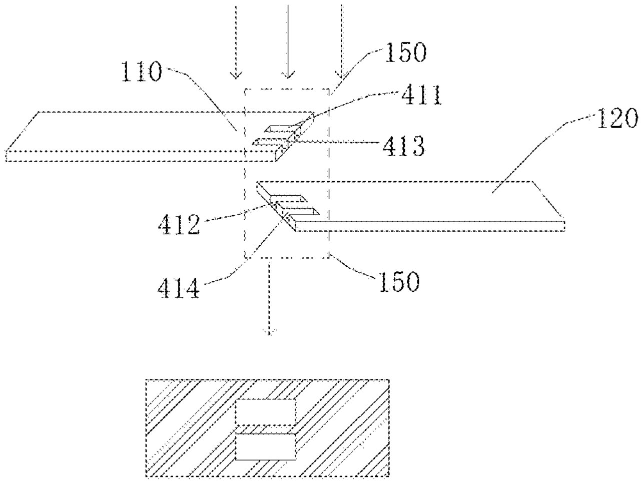
FIG. 10 shows schematic views illustrating shapes of orthographic projections of the first electrode layer and the second electrode layer projected onto the first dielectric layer provided by the present application.

Referring to FIG. 10, in an embodiment, the end of the first electrode layer 110 proximate to the second electrode layer 120 has a third opening 413. The third opening 413 and the first opening 411 are arranged at an interval. The end of the second electrode layer 120 proximate to the first electrode layer 110 has a fourth opening 414. The fourth opening 414 and the second opening 412 are arranged at intervals. The orthographic projections of the third opening 413 and the fourth opening 414 projected onto the first dielectric layer 100 coincide. It may be understood that the first opening 411 and the third opening 413 may have the same shape and the same size. The second opening 412 and the fourth opening 414 may have the same size and the same shape. The distance between the first opening 411 and the third opening 413 may be the same. The distance between the second opening 412 and the fourth opening 414 may be the same. The third opening 413 and the fourth opening 414 may be located at the portions of the first electrode layer 110 and the second electrode layer 120 respectively, which correspond to the overlapped portion of the orthographic projections of the first electrode layer 110 and the second electrode layer 120 projected onto the first dielectric layer 100. The third opening 413 and the fourth opening 414 further optimize the distribution of the local magnetic field, thereby improving the detection effect of a specific position of the body part to be detected.

It may be understood that, after the first electrode layer 110 and the second electrode layer 120 in FIG. 10 rotate 180 degrees in horizontal directions relative to the first dielectric layer 100 from left to right, the positional relationship of the first electrode layer 110 and the second electrode layer 120 is the same as that of the first electrode layer 110 and the second electrode layer 120 relative to the first dielectric layer 100 shown in FIG. 5.

Figure 11:
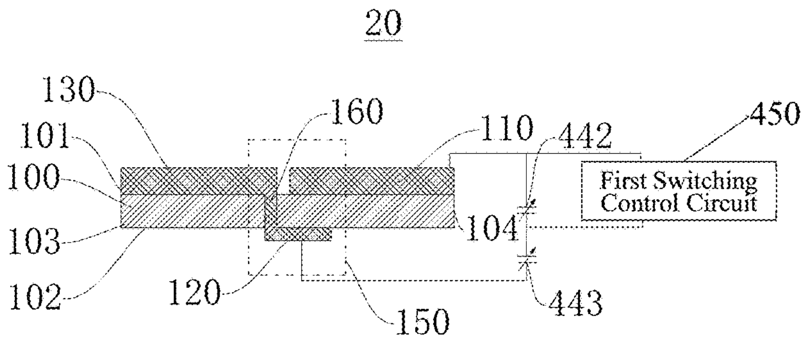
FIG. 11 a view showing a structure of the second magnetic field enhancing device provided by the present application.

Referring to FIG. 11, the second magnetic field enhancing component 20 further includes a third electrode layer 130. The third electrode layer 130 is arranged on the first surface 101. The third electrode layer 130 extends from the first end 103 towards the second end 104. The third electrode layer 130 covers part of the first surface 101 and is spaced apart from the first electrode layer 110. The second electrode layer 120 is electrically connected to the third electrode layer 130.

The second electrode layer 120 and the first electrode layer 110 each may be electrically connected to a second switching control circuit 460 or the first switching control circuit 450. Embodiments of the first dielectric layer 100, the first electrode layer 110, and the second electrode layer 120 may be the same as or similar to those of the first dielectric layer 100, the first electrode layer 110, and the second electrode layer 120 in the first magnetic field enhancing component 10 shown in FIG. 1, which will not be repeated herein.

The third electrode layer 130 may have the same thickness as the first electrode layer 110. The third electrode layer 130 may be configured to pass through the first dielectric layer 100 and then is connected to the second electrode layer 120. The third electrode layer 130 may also be connected to the second electrode layer 120 by a wire passing through the first dielectric layer 100. When the second magnetic field enhancing component 20 is placed in the excitation field of the MRI system, the first electrode layer 110, the third electrode layer 130 and the third electrode layer 130 may function as an inductor.

The third electrode layer 130 may extend from the first end 103 towards the second end 104 of the first dielectric layer 100, and gradually approach the second electrode layer 120. The third electrode layer 130 is insulated from the first electrode layer 110, thus preventing the first structural capacitor 150 formed by the first electrode layer 110 and the second electrode layer 120 from being short-circuited. The first electrode layer 110 and the third electrode layer 130 are arranged on the same side of the first dielectric layer 100. Therefore, when the second magnetic field enhancing component 20 is installed on the supporting structure, it is installed such that the first surface 101 faces a side away from the supporting structure, thereby preventing the first electrode layer 110 and the third electrode layer 130 from being damaged by the support.

In an embodiment, a length of the third electrode layer 130 is less than half of the length of the first dielectric layer 100. The length of the third electrode layer 130 is greater than one third of the length of the first dielectric layer 100. Within this range, the equivalent inductor formed by the third electrode layer 130 has a greater length, which can effectively increase the area of the effective magnetic field generated by the second magnetic field enhancing component 20.

In an embodiment, the third electrode layer 130 is strip-shaped, and the extension direction and the width of the third electrode layer 130 are the same as those of the first electrode layer 110, respectively. That is, the width of the third electrode layer 130 and the width of the first electrode layer 110 may be identical, and the third electrode layer 130 and the first electrode layer 110 may be located on the same straight line. The width of the first dielectric layer 100 may be equal to the width of the third electrode layer 130 and the width of the first electrode layer 110, or slightly larger than the width of the third electrode layer 130 and the width of the first electrode layer 110. Therefore, the width of the first dielectric layer 100 may be reduced as much as possible.

Figure 12:
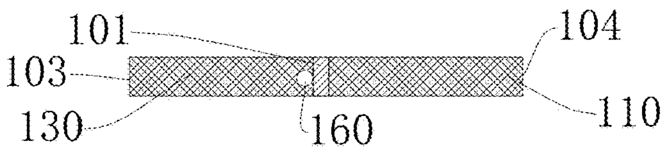
FIG. 12 is a top view of the second magnetic field enhancing device provided by the present application.
Figure 13:
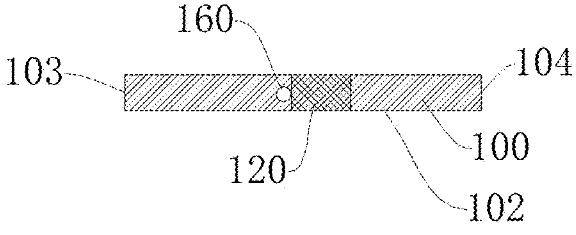
FIG. 13 is a bottom view of the second magnetic field enhancing device provided by the present application.

Referring to FIG. 12 and FIG. 13, in an embodiment, the first dielectric layer 100 has a through hole 160. Electrode material is arranged in the through hole 160. The third electrode layer 130 is electrically connected to the second electrode layer 120 through the electrode material. The electrode material may be the same as the materials of the third electrode layer 130 and the second electrode layer 120, so that resistance may be reduced. In an embodiment, the electrode material in the through hole 160 is integrally formed with the first electrode and the third electrode layer 130.

In an embodiment, one end of the third electrode layer 130 proximate to the first electrode layer 110 coincides with the orthographic projection of the through hole 160. One end of the second electrode layer 120 away from the first electrode layer 110 coincides with the orthographic projection of the through hole 160. That is, the third electrode layer 130 is in contact with the electrode material in the through hole 160 proximate to the first surface 101, and the second electrode layer 120 is in contact with the electrode material in the through hole 160 proximate to the second surface 102. Therefore, the third electrode layer 130 and the second electrode layer 120 are electrically connected by the electrode material in the through hole 160.

Figure 14:
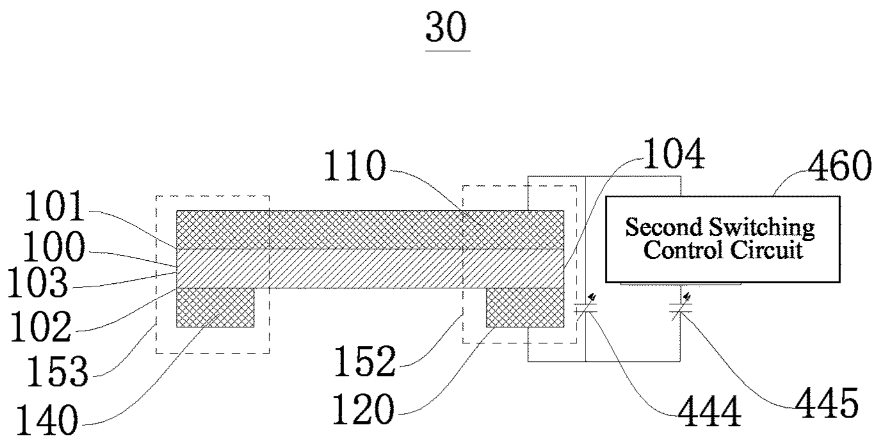
FIG. 14 is a view showing a structure of a third magnetic field enhancing device provided by the present application.

Referring to FIG. 14, in an embodiment, the magnetic field enhancing component is a third magnetic field enhancing component 30. The third magnetic field enhancing component 30 includes a third external capacitor 444, a fourth external capacitor 445 and the second switching control circuit 460. Embodiments of the first dielectric layer 100, the first electrode layer 110, the second electrode layer 120, and the four-electrode layer 140 are the same as or similar to those of the first dielectric layer 100, the first electrode layer 110, the second electrode layer 120, and the four-electrode layer 140 of the first magnetic field enhancing component 10 in FIG. 1, which will not be repeated herein. Two terminals of the third external capacitor 444 are connected to the first electrode layer 110 and the second electrode layer 120, respectively. One terminal of the fourth external capacitor 445 is connected to the second electrode layer 120, another terminal of the fourth external capacitor 445 is connected to one terminal of the second switching control circuit 460, and another terminal of the second switching control circuit 460 is connected to the first electrode layer 110. The second switching control circuit 460 is configured to be turned on in the RF transmitting period and to be turned off in the RF receiving period.

The third external capacitor 444 and the fourth external capacitor 445 may be fixed capacitors or variable capacitors. When the application environment of the third magnetic field enhancing component 30 is determined, for example, the frequency of the RF coil is determined, a fixed capacitor may be selected according to requirements, so that the resonant frequency of the magnetic field enhancing device 80 composed of a plurality of the third magnetic field enhancing components 30 is equal to the frequency of the RF coil, thereby enhancing the magnetic field. When the application environment of the third magnetic field enhancing component 30 is uncertain, for example, when the frequency of the RF coil is uncertain, the third external capacitor 444 and the fourth external capacitor 445 may be variable capacitors. The resonant frequency of the magnetic field enhancing device 80 may be adjusted by adjusting the variable capacitors, thus enabling the magnetic field enhancing device 80 to be applied in different environments.

There is a time difference of tens to thousands of milliseconds between the RF transmitting period and the RF receiving period. The difference in the RF power between the RF transmitting period and the RF receiving period reaches 3 orders of magnitude. In the RF transmitting period, the voltage across the second structural capacitor 152 and the voltage across the third structural capacitor 153 ranges from several volts to hundreds of volts. In the RF receiving period, the voltage across the second structural capacitor 152 and the voltage across the third structural capacitor 153 are at a millivolt level.

The second switching control circuit 460 and the fourth external capacitor 445 are connected in series between the first electrode layer 110 and the second electrode layer 120. In an embodiment, the one terminal of the second switching control circuit 460 is connected to the one terminal of the fourth external capacitor 445, and the other terminal of the second switching control circuit 460 is connected to the first electrode layer 110. The other terminal of the fourth external capacitor 445 is connected to the second electrode layer 120. In an embodiment, the one terminal of the second switching control circuit 460 is connected to the one terminal of the fourth external capacitor 445. The other terminal of the second switching control circuit 460 is connected to the second electrode layer 120. The other terminal of the fourth external capacitor 445 is connected to the first electrode layer 110.

Therefore, when the second switching control circuit 460 is turned on, the fourth external capacitor 445 and the third external capacitor 444 are connected in parallel between the first electrode layer 110 and the second electrode layer 120. Compared with two capacitors connected in series, the fourth external capacitor 445 and the third external capacitor 444 connected in parallel achieve a larger capacitance value, therefore, when the total capacitance of the third magnetic field enhancing component 30 is constant, the capacitance value of the second structural capacitor 152 and the capacitance value of the third structural capacitor 153 may be smaller, and the first magnetic field enhancing component 10 has a lower loss.

In the RF transmitting period, the resonant frequency of the magnetic field enhancing device 80 composed of the plurality of the third magnetic field enhancing component 30 deviates far from the operating frequency of the MRI system. By connecting the fourth external capacitor 445 and the third external capacitor 444, it can be ensured that, in the RF transmitting period of the MRI system, the magnetic field intensity in the detected region remains the original magnetic field intensity, thereby eliminating the interference of the third magnetic field enhancing component 30 in the RF transmitting period. The clinical practicability of the magnetic field enhancing device 80 composed of the plurality of third magnetic field enhancing components 30 is significantly improved, and the magnetic field enhancing device 80 can be applied to all sequences of the MRI system.

In the RF transmitting period, the voltage difference between the first electrode layer 110 and the second electrode layer 120 is comparatively large, and the second switching control circuit 460 is turned on. The third external capacitor 444 and the fourth external capacitor 445 are connected in parallel between the first electrode layer 110 and the second electrode layer 120.

However, in the RF receiving period, the voltage difference between the first electrode layer 110 and the second electrode layer 120 is comparatively small, and the second switching control circuit 460 is turned off. The third external capacitor 444 is connected in series between the first electrode layer 110 and the second electrode layer 120. When the third external capacitor 444 is a fixed capacitor, the third external capacitor 444 may be selected according to requirements, so that the resonant frequency of the magnetic field enhancing device 80 composed of the plurality of the third magnetic field enhancing components 30 is equal to the frequency of the RF coil. The resonant frequency of the magnetic field enhancing device 80 is equal to the frequency of the RF coil, which can greatly enhance the RF receiving field and improve the signal-to-noise ratio of an image. When the third external capacitor 444 is a variable capacitor, by adjusting the third external capacitor 444, the resonant frequency of the magnetic field enhancing device 80 composed of the plurality of the third magnetic field enhancing components 30 may be equal to the frequency of the RF coil.

Figure 15:
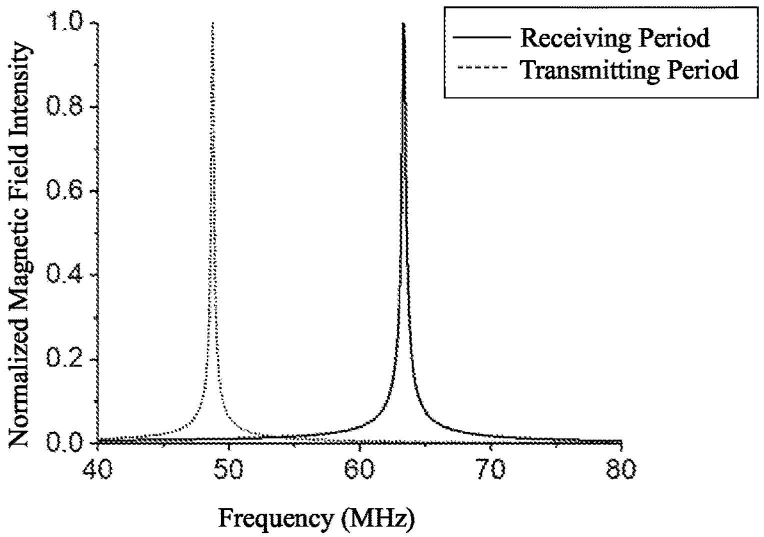
FIG. 15 is a view showing a comparison between frequencies in the RF transmitting period and frequencies in the RF receiving period of a magnetic field enhancing device provided by the present application.

Referring to FIG. 15, the third external capacitor 444 and the fourth external capacitor 445 enable the magnetic field enhancing device 80 composed of the plurality of the third magnetic field enhancing components 30 to have a better resonant frequency in the RF receiving period, thereby making the resonant frequency of the magnetic field enhancing device 80 composed of the plurality of the third magnetic field enhancing components 30 in the RF receiving period reach the operating frequency of the MRI system.

In the third magnetic field enhancing component 30 provided in the embodiments of the present application, the second switching control circuit 460 is configured to be turned on in the RF transmitting period and to be turned off in the RF receiving period. In the RF transmitting period, the resonant frequency of the magnetic field enhancing device 80 composed of the plurality of the third magnetic field enhancing components 30 deviates far from the operating frequency of the MRI system, and the fourth external capacitor 445 and the third external capacitor 444 enable the magnetic field intensity in the detected region of the MRI system in the RF transmitting period to remain the original magnetic field intensity, thereby eliminating the interference of the third magnetic field enhancing component 30 in the RF transmitting period. The clinical practicability of the magnetic field enhancing device 80 composed of the plurality of the third magnetic field enhancing components 30 is significantly improved. The magnetic field enhancing device 80 may be applied to all sequences of the MRI system.

The third magnetic field enhancing component 30 is an easily adjustable partially-tuned nonlinear metasurface device for enhancement of MR imaging. The control mode of the second switching control circuit 460 of the easily adjustable partially-tuned nonlinear metasurface device for enhancement of MR imaging is simple. The second switching control circuit 460 of the easily adjustable partially-tuned nonlinear metasurface device for enhancement of MR imaging is configured to be turned on in the RF transmitting period and to be turned off in the RF receiving period. In the RF transmitting period, by using the nonlinear resonant property, the fourth external capacitor 445 and the third external capacitor 444 may ensure that a frequency band, which is focused by the easily adjustable partially-tuned nonlinear metasurface device for enhancement of MR imaging, has only part of the tuning function. The magnetic field intensity in the detected region remains the original magnetic field intensity, which can eliminate the interference of the third magnetic field enhancing component 30 in the RF transmitting period. The clinical practicability of the magnetic field enhancing device 80 composed of the plurality of easily adjustable MRI-image enhancing metasurface devices with partially tuned nonlinear resonant property is significantly improved, therefore, the magnetic field enhancing device 80 may be applied to all sequences of the MRI system, thereby effectively improving a display effect of an image.

Figure 16:
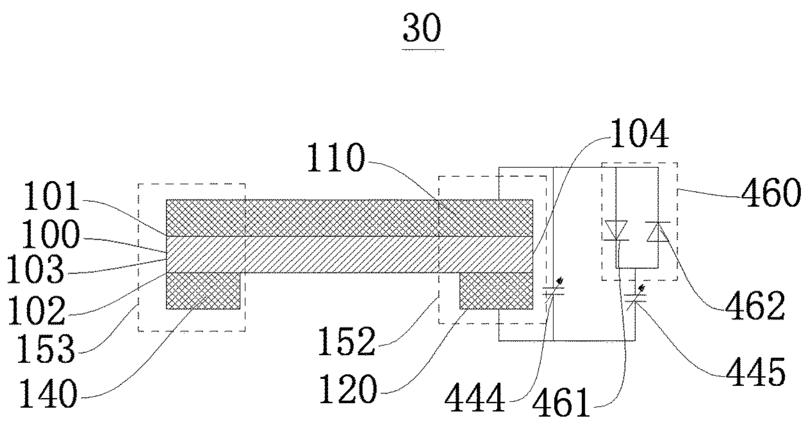
FIG. 16 is a view showing a structure of the third magnetic field enhancing device provided by the present application.

Referring to FIG. 16, in an embodiment, the second switching control circuit 460 includes a third diode 461 and a fourth diode 462. An anode of the third diode 461 is connected to the first electrode layer 110. A cathode of the fourth diode 462 is connected to the first electrode layer 110. The one terminal of the fourth external capacitor 445 is connected to the second electrode layer 120, and the other terminal of the fourth external capacitor 445 is connected to a cathode of the third diode 461 and an anode of the fourth diode 462, respectively.

It may be understood that a forward voltage of the third diode 461 and a forward voltage of the fourth diode 462 may be between 0 volt to 1 volt. In an embodiment, the forward voltages of the third diode 461 and the fourth diode 462 may be 0.8V. The third diode 461 and the fourth diode 462 each are connected in series between the first electrode layer 110 and the second electrode layer 120, that is, the third diode 461 and the fourth diode 462 are reversely connected.

Due to the AC characteristics of the RF, the induced voltages generated by the first electrode layer 110 and the second electrode layer 120 are also the AC voltages. In the RF transmitting period, the voltage difference between the first electrode layer 110 and the second electrode layer 120 exceeds the forward voltages of the third diode 461 and the fourth diode 462. Therefore, no matter which of the first electrode layer 110 and the second electrode layer 120 has a higher voltage, one of the third diode 461 and the fourth diode 462 is always in a conducting state. Therefore, in the RF transmitting period, the third external capacitor 444 and the fourth external capacitor 445 each are connected in parallel between the first electrode layer 110 and the second electrode layer 120.

During the RF receiving period, since the voltage difference between the first electrode layer 110 and the second electrode layer is less than the forward voltages of the third diode 461 and the fourth diode 462, no matter which of the first electrode layer 110 and the second electrode layer 120 has a higher voltage, the third diode 461 and the fourth diode 462 are in a non-conducting state. At this time, in the RF receiving period, only the third external capacitor 444 is connected between the first electrode layer 110 and the second electrode layer 120.

Figure 17:
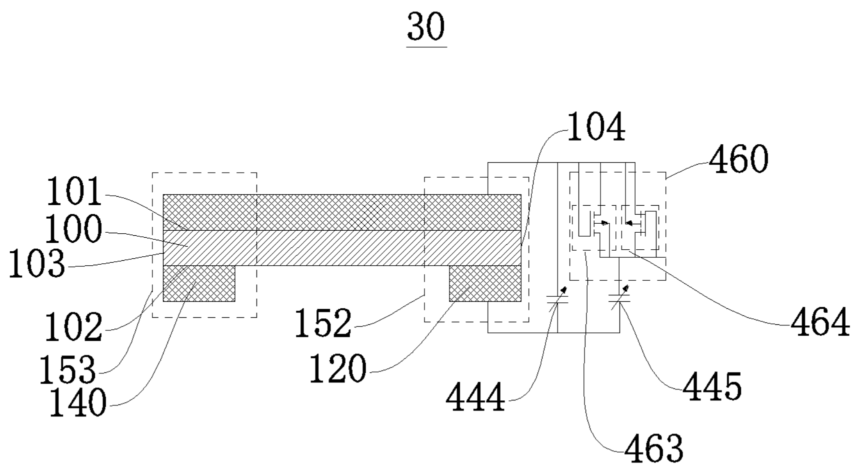
FIG. 17 is a view showing a structure of the third magnetic field enhancing device provided by the present application.

Referring to FIG. 17, in an embodiment, the second switching control circuit 460 further includes a third enhancement-mode MOSFET 463 and a fourth enhancement-mode MOSFET 464. The drain of the third enhancement-mode MOSFET 463 is connected to the first electrode layer 110. The grid of the third enhancement-mode MOSFET 463 is connected to the first electrode layer 110. The source of the fourth enhancement-mode MOSFET 464 is connected to the first electrode layer 110. The one terminal of the fourth external capacitor 445 is connected to the second electrode layer 120, and the other terminal of the fourth external capacitor 445 is connected to the source of the third enhancement-mode MOSFET 463, the drain of the fourth enhancement-mode MOSFET 464 and the grid of the fourth enhancement-mode MOSFET 464.

It may be understood that the third enhancement-mode MOSFET 463 and the fourth enhancement-mode MOSFET 464 are turned off when the grid voltages thereof are less than a threshold voltage, that is, only when the grid voltage is greater than the threshold voltage, can a conductive channel appear.

In the RF transmitting period, the voltage difference between the first electrode layer 110 and the second electrode layer 120 exceeds the threshold voltage which allows the third enhancement-mode MOSFET 463 and the fourth enhancement-mode MOSFET 464 to be turned on, therefore no matter which of the first electrode layer 110 and the second electrode layer 120 has a higher voltage, one of the third enhancement-mode MOSFET 463 and the fourth enhancement-mode MOSFET 464 is always in a conducting state. Therefore, in the RF transmitting period, the third external capacitor 444 and the fourth external capacitor 445 each are connected in parallel between the first electrode layer 110 and the second electrode layer 120.

However, in the RF receiving period, the voltage difference between the first electrode layer 110 and the second electrode layer is less than the threshold voltage which allows the third enhancement-mode MOSFET 463 and the fourth enhancement-mode MOSFET 464 to be turned on, therefore, no matter which of the first electrode layer 110 and the second electrode layer 120 has a higher voltage, the third enhancement-mode MOSFET 463 and the fourth enhancement-mode MOSFET 464 both are in a non-conducting state. Therefore, in the RF receiving period, the third external capacitor 444 is connected between the first electrode layer 110 and the second electrode layer 120.

In an embodiment, the one terminal of the second switching control circuit 460 is connected to a portion of the second electrode layer 120, which corresponds to the overlapped portion of the orthographic projections of the first electrode layer 110 and the second electrode layer 120 projected onto the first dielectric layer 100. The other terminal of the second switching control circuit 460 is connected to a portion of the first electrode layer 110, which corresponds to the overlapped portion of the orthographic projections of the first electrode layer 110 and the second electrode layer 120 projected onto the first dielectric layer 100. That is, the portion of the first electrode layer 110, to which the second switching control circuit 460 is connected, is the portion of the first electrode layer 110 forming the second structural capacitor 152. The other portion of the first electrode layer 110, which is not used to form the second structural capacitor 152 and the third structural capacitor 153, functions as the equivalent inductor. Therefore, the second switching control circuit 460 can be prevented from being connected to the other portion of the first electrode layer 110, which is not used to form the second structural capacitor 152 and the third structural capacitor 153, thereby avoiding affecting the portion of the first electrode layer 110, which forms the equivalent inductor.

Figure 18:
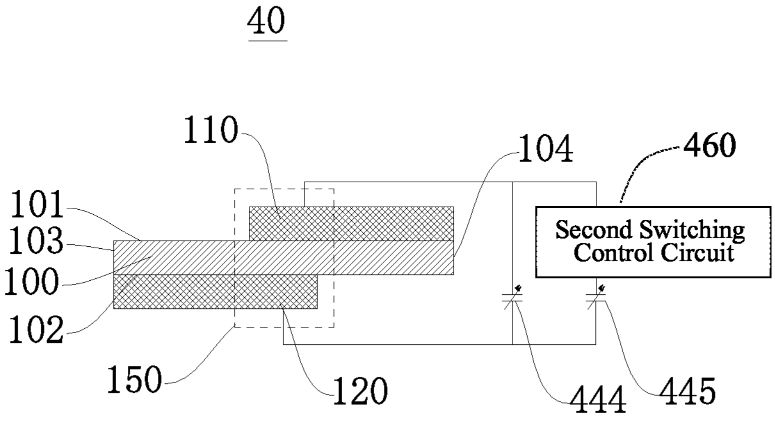
FIG. 18 is a view showing a structure of a fourth magnetic field enhancing device provided by the present application.

Referring to FIG. 18, an embodiment of the present application further provides a magnetic field enhancing component. The magnetic field enhancing component is a fourth magnetic field enhancing component 40. The fourth magnetic field enhancing component 40 includes the first electrode layer 110, the second electrode layer 120, the first dielectric layer 100, the third external capacitor 444, the fourth external capacitor 445, and the second switching control circuit 460. Embodiments of the first electrode layer 110, the second electrode layer 120, and the first dielectric layer 100 are the same as or similar to those of the first electrode layer 110, the second electrode layer 120, and the first dielectric layer 100 of the second magnetic field enhancing component 20 in FIG. 5, FIG. 6, FIG. 7, FIG. 8, FIG. 9 and FIG. 10, which will not be repeated herein.

Two terminals of the third external capacitor 444 are connected to the first electrode layer 110 and the second electrode layer 120, respectively. The fourth external capacitor 445 and the second switching control circuit 460 are connected in series between the first electrode layer 110 and the second electrode layer 120. The second switching control circuit 460 is configured to be turned on in the RF transmitting period, and to be turned off in the RF receiving period. The embodiment of the second switching control circuit 460 is the same as or similar to that of the second switching control circuit 460 in FIG. 14, FIG. 16 and FIG. 17, which will not be repeated herein.

Figure 19:
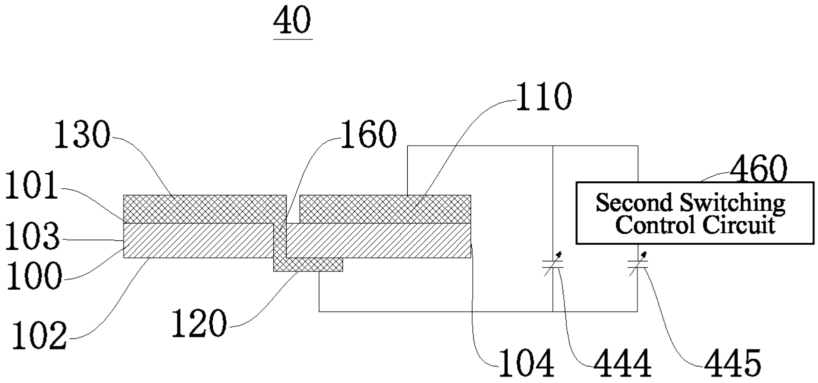
FIG. 19 is a view showing a structure of the fourth magnetic field enhancing device provided by the present application.

Referring to FIG. 19, in an embodiment, the fourth magnetic field enhancing component 40 further includes the third electrode layer 130 arranged on the first surface 101. The third electrode layer 130 covers part of the first surface 101 and is arranged apart from the first electrode layer 110. The second electrode layer 120 is electrically connected to the third electrode layer 130. The structural and positional features of the third electrode layer 130 are the same as or similar to the embodiment of the third electrode layer 130 in the second magnetic field enhancing component 20 in FIG. 11, FIG. 12 and FIG. 13, which will not be repeated herein.

Figure 20:
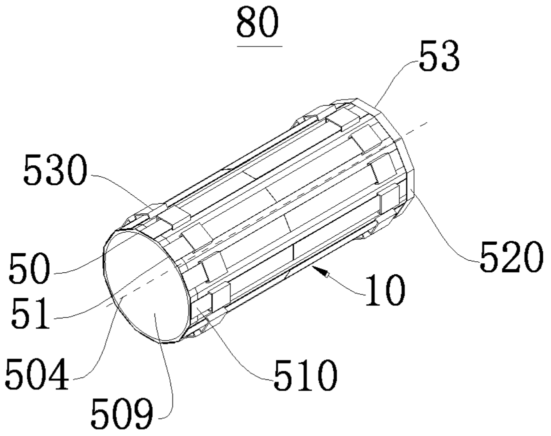
FIG. 20 is a three-dimensional view showing a magnetic field enhancing device provided by the present application.
Figure 21:
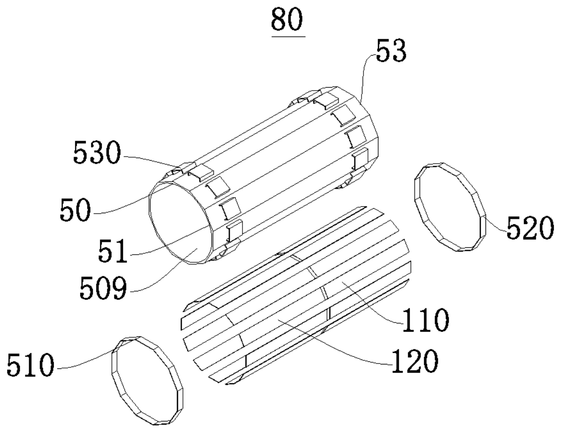
FIG. 21 is an exploded view showing the magnetic field enhancing device provided by the present application.

Referring to FIG. 20 and FIG. 21, an embodiment of the present application further provides a magnetic field enhancing device 80. The magnetic field enhancing device 80 includes a cylindrical supporting structure 50, a first annular conductive sheet 510, a second annular conductive sheet 520, and a plurality of magnetic field enhancing components. The magnetic field enhancing components include one or more of the first magnetic field enhancing component 10, the second magnetic field enhancing component 20, the third magnetic field enhancing component 30, and the fourth magnetic field enhancing component 40. The cylindrical supporting structure 50 has two opposite and spaced ends: a third end 51 and a fourth end 53. The plurality of magnetic field enhancing components each extend from the third end 51 to the fourth end 53. The first annular conductive sheet 510 is arranged on the cylindrical supporting structure 50 and proximate to the third end 51. The first annular conductive sheet 510 is electrically connected to portions of the plurality of magnetic field enhancing components located at the third end 51. The second annular conductive sheet 520 is arranged on the cylindrical supporting structure 50 and proximate to the fourth end 53. The second annular conductive sheet 520 is electrically connected to portions, located at the fourth end 53, of the plurality of magnetic field enhancing components. The cylindrical supporting structure 50 may enclose a detecting space 509. The detecting space 509 may be used for receiving a body part to be detected. The body part to be detected may be an arm, a leg, an abdomen, or the like. The plurality of magnetic field enhancing components are spaced at equal intervals, thereby improving the uniformity of a local magnetic field.

The plurality of the magnetic field enhancing components may be arranged and spaced at equal intervals on the side surface of the cylindrical supporting structure 50. The first annular conductive sheet 510 and the second annular conductive sheet 520 are arranged on the two opposite ends of the cylindrical supporting structure 50, respectively, and arranged around an axis 504 of the cylindrical supporting structure 50. Two ends of each magnetic field enhancing component are connected to the first annular conductive sheet 510 and the second annular conductive sheet 520, respectively.

When a plurality of first magnetic field enhancing components 10 or a plurality of third magnetic field components 30 are arranged at equal intervals on the side surface of the cylindrical supporting structure 50, the first annular conductive sheet 510 is electrically connected to the second electrode layers 120, and the second annular conductive sheet 520 is electrically connected to the fourth electrode layers 140.

When a plurality of second magnetic field enhancing components 20 or a plurality of the fourth magnetic field enhancing components 40 are arranged at equal intervals on the side surface of the cylindrical supporting structure 50, the first annular conductive sheet 510 is electrically connected to the first electrode layers 110, and the second annular conductive sheet 520 is electrically connected to the second electrode layers 120.

The first annular conductive sheet 510 and the second annular conductive sheet 520 have an annular structure. The first annular conductive sheet 510 and the second annular conductive sheet 520 may be arranged to surround the axis 504 of the cylindrical supporting structure 50 respectively. In an embodiment, the first annular conductive sheet 510 and the second annular conductive sheet 520 may fit over an outer wall of the cylindrical supporting structure 50, and are connected to the first electrode layer 110 and the second electrode layer 120 of each magnetic field enhancing component, respectively. The plurality of magnetic field enhancing components are connected head to tail through the first annular conductive sheet 510, the second annular conductive sheet 520, the first electrode layer 110, and the second electrode layer 120, so that the magnetic field enhancing device 80 is isotropic, thereby improving the uniformity of the magnetic field.

In an embodiment, a plurality of limiting structures 530 are arranged at intervals around the side surface of the cylindrical supporting structure 50. In the direction from the third end 51 to the fourth end 53, two limiting structures 530 are arranged correspondingly for each magnetic field enhancing component. That is, the two limiting structures 530 are fixed on two ends of one magnetic field enhancing component respectively to fix the magnetic field enhancing component on the side wall of the cylindrical supporting structure 50.

In an embodiment, the limiting structure 530 may be a through slot. The through slot may be configured to allow an insertion of the magnetic field enhancing component. Two through slots restrict two ends of the magnetic field enhancing component, respectively. The magnetic field enhancing component may be fixed on the side surface of the cylindrical supporting structure 50 through the limiting structures 530.

An embodiment of the present application further provides an MRI system. The MRI system includes the magnetic field enhancing device 80.

The technical features of the embodiments above may be combined arbitrarily. For the purpose of concision, not all possible combinations of the technical features of the embodiments above are described. However, as long as there are no contradictions between the combinations of these technical features, all combinations should be within the scope of the description of this specification.

The embodiments described above only illustrate several implementations of the present application, and the description of which is more specific and detailed, but cannot therefore be understood to limit the scope of the present application. It should be noted that, for those of ordinary skill in the art, various modifications and improvements may be made without departing from the concept of the present application, and all of the modifications and improvements fall within the protection scope of the present application. Therefore, the protection scope of the present application shall be subject to the appended claims.

The invention claimed is:

1. A magnetic field enhancing component, comprising:

a first dielectric layer comprising a first surface and a second surface opposite to each other;

a first electrode layer arranged on the first surface;

a second electrode layer and a fourth electrode layer, which are arranged on the second surface at an interval, wherein orthographic projections of the first electrode layer and the second electrode layer, which are projected onto the first dielectric layer, overlap each other, and orthographic projections of the first electrode layer and the fourth electrode layer, which are projected onto the first dielectric layer, overlap each other; and a first external capacitor, a second external capacitor, and a first switching control circuit;

wherein one terminal of the second external capacitor is connected to the second electrode layer, and an other terminal of the second external capacitor is connected to one terminal of the first external capacitor and one terminal of the first switching control circuit, respectively;

another terminal of the first external capacitor and another terminal of the first switching control circuit each are connected to the first electrode layer; and the first switching control circuit is configured to be turned on in an RF transmitting period and to be turned off in an RF receiving period;

the first switching control circuit comprises:

a first diode, an anode of the first diode being connected to the first electrode layer; and a second diode, a cathode of the second diode being connected to the first electrode layer;

wherein the other terminal of the second external capacitor is connected to a cathode of the first diode, an anode of the second diode, and the one terminal of the first external capacitor, respectively.

2. The magnetic field enhancing component according to claim 1, wherein the first dielectric layer comprises a first end and a second end opposite to each other; the first electrode layer arranged on the first surface is configure to extend from the first end to the second end; the second electrode layer is located on the second end of the second surface; and the fourth electrode layer is located on the first end of the second surface.

3. The magnetic field enhancing component according to claim 1, wherein thickness of the first electrode layer, thickness of the second electrode layer, and thickness of the fourth electrode layer are equal, and planes where the first electrode layer, the second electrode layer, the fourth electrode layer, and the first dielectric layer are located respectively, are substantially parallel to each other.

4. The magnetic field enhancing component according to claim 1, wherein the first dielectric layer is made of insulating material, and the first dielectric layer has a rectangular plate structure.

5. The magnetic field enhancing component according to claim 1, wherein, the first dielectric layer is made of epoxy glass fiber; the first electrode layer and the second electrode layer have rectangular plate structures; and the first electrode layer and the second electrode layer are made of conductive and non-magnetic material.

6. A magnetic field enhancing device, comprising:

a cylindrical supporting structure having a third end and a fourth end which spaced and opposite to each other;

a plurality of magnetic field enhancing components according to claim 1, which are arranged on the cylindrical supporting structure at intervals and extend from the third end towards the fourth end;

a first annular conductive sheet arranged on the cylindrical supporting structure and proximate to the third end, and electrically connected to portions of the plurality of magnetic field enhancing components located at the third end; and a second annular conductive sheet arranged on the cylindrical supporting structure and proximate to the fourth end, and electrically connected to portions of the plurality of magnetic field enhancing components located at the fourth end.

7. A magnetic field enhancing component, comprising:

a first dielectric layer comprising a first surface and a second surface arranged opposite to each other;

a first electrode layer arranged on the first surface and covering part of the first surface;

a second electrode layer arranged on the second surface and covering part of the second surface, wherein an orthographic projection of the first electrode layer projected onto the first dielectric layer overlaps an orthographic projection of the second electrode layer projected onto the first dielectric layer to form a first structural capacitor;

a third electrode layer arranged on the first surface and spaced apart from the first electrode layer, and the third electrode layer covering part of the first surface, and the second electrode layer being electrically connected to the third electrode layer; and a first external capacitor, a second external capacitor and a first switching control circuit;

wherein one terminal of the second external capacitor is connected to the second electrode layer, and another terminal of the second external capacitor is connected to one terminal of the first external capacitor and one terminal of the first switching control circuit, respectively;

another terminal of the first external capacitor and another terminal of the first switching control circuit each are connected to the first electrode layer; and the first switching control circuit is configured to be turned on in an RF transmitting period and to be turned off in an RF receiving period.

8. The magnetic field enhancing component according to claim 7, wherein, the first dielectric layer comprises a first end and a second end opposite to each other;

the first electrode layer and the second electrode layer are strip-shaped and have the same width; the first electrode layer extends from the second end towards the first end; the second electrode layer extends from the first end towards the second end; and the orthographic projection of the first electrode layer projected onto the first dielectric layer overlaps the orthographic projection of the second electrode layer projected onto the first dielectric layer to form the first structural capacitor.

9. The magnetic field enhancing component according to claim 8, wherein an overlapped portion of the orthographic projections of the first electrode layer and the second electrode layer respectively projected onto the first dielectric layer is located in a middle of the first dielectric layer.

10. The magnetic field enhancing component according to claim 9, wherein an end of the first electrode layer proximate to the second electrode layer has a first opening; an end of the second electrode layer proximate to the first electrode layer has a second opening; orthographic projections of the first opening and the second opening respectively projected onto the first dielectric layer coincide.

11. A magnetic field enhancing device, comprising:

a cylindrical supporting structure having a third end and a fourth end which spaced and opposite to each other;

a plurality of magnetic field enhancing components according to claim 7, which are arranged on the cylindrical supporting structure at intervals and extend from the third end towards the fourth end;

a first annular conductive sheet arranged on the cylindrical supporting structure and proximate to the third end, and electrically connected to portions of the plurality of magnetic field enhancing components located at the third end; and a second annular conductive sheet arranged on the cylindrical supporting structure and proximate to the fourth end, and electrically connected to portions of the plurality of magnetic field enhancing components located at the fourth end.

12. A magnetic field enhancing component, comprising:

a first dielectric layer comprising a first surface and a second surface opposite to each other;

a first electrode layer arranged on the first surface;

a second electrode layer and a fourth electrode layer, which are arranged on the second surface at an interval; wherein orthographic projections of the first electrode layer and the second electrode layer, which are projected onto the first dielectric layer, overlap each other, and orthographic projections of the first electrode layer and the fourth electrode layer, which are projected onto the first dielectric layer, overlap each other; and a third external capacitor, two terminals of the third external capacitor being connected to the first electrode layer and the second electrode layer, respectively; and a fourth external capacitor and a second switching control circuit, wherein one terminal of the fourth external capacitor is connected to the second electrode layer; an other terminal of the fourth external capacitor is connected to one terminal of the second switching control circuit; another terminal of the second switching control circuit is connected to the first electrode layer; and the second switching control circuit is configured to be turned on in an RF transmitting period and to be turned off in an RF receiving period;

the second switching control circuit comprises:

- a third diode, an anode of the third diode being connected to the first electrode layer; and
- a fourth diode, a cathode of the fourth diode being connected to the first electrode layer;

wherein the other terminal of the fourth external capacitor is connected to a cathode of the third diode and an anode of the fourth diode, respectively.

13. A magnetic field enhancing device, comprising:

a cylindrical supporting structure having a third end and a fourth end which spaced and opposite to each other;

a plurality of magnetic field enhancing components according to claim 11, which are arranged on the cylindrical supporting structure at intervals and extend from the third end towards the fourth end;

a first annular conductive sheet arranged on the cylindrical supporting structure and proximate to the third end, and electrically connected to portions, located at the third end, of the plurality of magnetic field enhancing components; and a second annular conductive sheet arranged on the cylindrical supporting structure and proximate to the fourth end, and electrically connected to portions, located at the fourth end, of the plurality of magnetic field enhancing components.

* * * * *